United States Patent
Hidaka

[19]

[11] Patent Number: 6,107,645
[45] Date of Patent: Aug. 22, 2000

[54] THERMOELECTRIC SYSTEM USING SEMICONDUCTOR

[75] Inventor: Norio Hidaka, Kawasaki, Japan

[73] Assignee: Fujitsu Limited, Kawasaki, Japan

[21] Appl. No.: 09/181,908

[22] Filed: Oct. 29, 1998

[30] Foreign Application Priority Data

Oct. 31, 1997 [JP] Japan ................................. 9-300717

[51] Int. Cl.⁷ ................................................ H01L 33/00
[52] U.S. Cl. ................................. 257/84; 257/85; 257/94; 257/96; 257/467; 257/470; 257/930; 438/54; 136/239
[58] Field of Search .................................. 257/467, 470, 257/930, 94, 96, 184, 97, 85, 84; 438/54; 136/239

[56] References Cited

U.S. PATENT DOCUMENTS

| | | | |
|---|---|---|---|
| 3,956,017 | 5/1976 | Shigemasa | 136/89 |
| 5,065,226 | 11/1991 | Kluitmans et al. | 357/74 |
| 5,187,714 | 2/1993 | Okazaki et al. | 372/36 |
| 5,262,658 | 11/1993 | Jankowski | 257/88 |
| 5,262,675 | 11/1993 | Bausman, Jr. | 257/714 |
| 5,689,087 | 11/1997 | Jack | 136/213 |

FOREIGN PATENT DOCUMENTS

| | | |
|---|---|---|
| 356042389 | 4/1981 | Japan . |
| 359200481 | 11/1984 | Japan . |
| 359204292 | 11/1984 | Japan . |
| 360015987 | 1/1985 | Japan . |
| 360022651 | 2/1985 | Japan . |
| 360117871 | 6/1985 | Japan . |

*Primary Examiner*—William Mintel
*Attorney, Agent, or Firm*—Armstrong, Westerman, Hattori, McLeland & Naughton

[57] ABSTRACT

A cold end and a hot end are demarcated in a first thermoelectric semiconductor member. A first member made from metal or a semiconductor is connected to the cold end of the first thermoelectric semiconductor member. The first member is made from a material wherein, heat absorption occurs when first carriers comprising either electrons or holes are injected from the first member into the first thermoelectric semiconductor member. The first carriers transported to the hot end of the first thermoelectric semiconductor member are gathered into a light-emitting region. The light-emitting region is made from a semiconductor material. In this light-emitting region, light emission due to recombination between electrons and holes occurs.

15 Claims, 8 Drawing Sheets

THERMOELECTRIC SYSTEM USING SEMICONDUCTOR

This application is based on Japanese patent application Hei 9-300717 filed on Oct. 31, 1997, the entire contents of which are incorporated herein by reference.

BACKGROUND OF THE INVENTION

1. Field of the Invention

The present invention relates to a thermoelectric system using a semiconductor, and more particularly to a light-emitting device, cooling device and electric power extracting device using the Peltier absorption effect.

With the increasing levels of integration in large-scale integrated circuits and the increasing scale of high-speed high-capacity computing systems, and the like, the amount of power consumed and the heat generated by such devices has increased, and so the cooling devices required for absorbing these large amounts of heat have also grown in size and capacity. Increase in the size of cooling devices impedes compactification, upgrading and the reduction of power consumption in the system overall. Moreover, with a conventional cooling device, if one area is cooled, heat is generated in another area. Therefore, it is necessary to provide heat diffusing apparatus in the area where heat is generated. If a cooling device which does not comprise a heat-generating region could be achieved, then compactification and reduction of power consumption, and the like, could be expected.

With the advance of research into the application of light energy in medical fields, such as physical abrasion in oncology, orthopaedics and dentistry, and industrial fields, such as precision machine engineering, semiconductor manufacture, and the like, demand has evolved for compact high-output table-top laser devices.

In recent years, with rising consumption of electric power, there has been consistent increase in the consumption of fuels used to make electricity, and problems which impact upon human survival in areas ranging from energy crises to environmental destruction, have been increasing, for instance, the depletion of energy resources, global warming due to carbon dioxide gas, and environmental pollution caused by exhaust gases. There is currently a world-wide search for energy sources which will relieve this problem and for new methods of extracting energy.

An ideal energy source is of course clean and inexhaustible in supply, and desirably the apparatus for extracting this energy is compact, but has high capacity and high efficiency.

Solar energy has been investigated as one possible future energy source, but although it is clean and inexhaustible, the power density falling on the earth is a low level of 1 kW/m², and the conversion efficiency of devices (solar cells) for extracting this energy is a low 20%. With improvements, it is predicted that 2–3 times the current figure will be possible, but even so, apparatus would have to be large in order to provide sufficient electrical power.

2. Description of the Related Art

Figure 7:
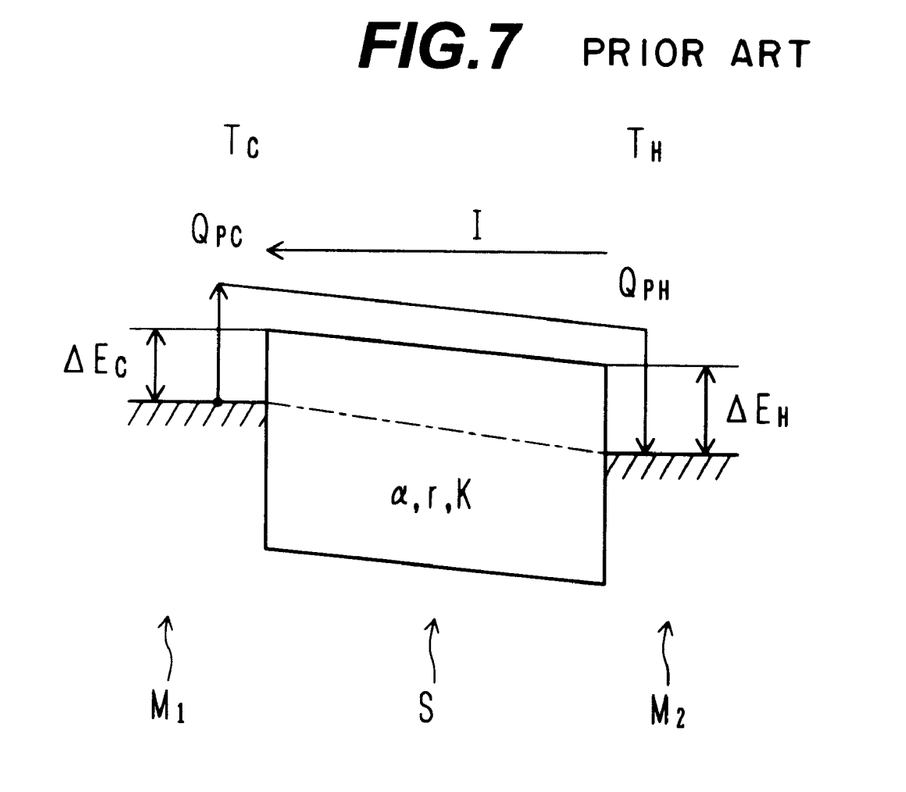
FIG. 7 is a band diagram of a conventional Peltier element.

FIG. 7 shows a band diagram of a conventional thermoelectric element. This element comprises metals $M_1$ and $M_2$ formed respectively contacting either side of a thermoelectric semiconductor S having a Seebeck coefficient of $\alpha$, resistance r, and thermal conductivity K. At the cold junction, a potential barrier of energy difference $\Delta E_c$ is formed between the Fermi level of metal $M_1$ and the level of the lower end of the conduction band in the n-type thermoelectric semiconductor S, and at the hot junction, a potential barrier of energy difference $\Delta E_H$ is formed between the Fermi level of metal $M_2$ and the level of the lower end of the conduction band in the n-type thermoelectric semiconductor S.

More precisely, a spike-shaped depletion layer is formed on the semiconductor S side of either junction, and since the thickness of the depletion layer is several nm, or so, electrons from metal $M_1$ pass to the lower end of the conduction band of the thermoelectric semiconductor S due to a tunnel effect. Therefore, it is possible to regard these electrons as facing an effective potential barrier of $\Delta E_c$.

A voltage $(\alpha\Delta T + rI)$ is applied between metals $M_1$ and $M_2$. $\alpha\Delta T$ corresponds to voltage required to obtain a temperature difference of $\Delta T$ between the two ends of the thermoelectric semiconductor S. By passing a current I, the electrons in the metal at the cold junction overcome the potential barrier $\Delta E_c$ and energy $Q_{PC}$ (Peltier absorption) is taken from the metal $M_1$. Therefore, the cold junction is cooled and its temperature falls to Tc.

This Peltier absorption energy $Q_{PC}$ is approximately equal to $(\Delta E_c + 2kT)$. Here, k is Boltzmann's constant and T indicates temperature. More specifically, it represents the temperature multiplied by the following Seebeck coefficient $\alpha$.

$$\alpha = (k/q)\{1n(N_{COND}/Nd) + 2\} (V/K)$$

Here, k is Boltzmann's constant, q is the unit of electricity, $N_{COND}$ is the effective state density in the conduction band, and Nd represents the donor density.

Electrons having energy $Q_{PC}$ move through the semiconductor S to the hot junction, and energy $Q_{PH}$ ($Q_{PC} + \alpha\Delta T_s I$ : Peltier emission) is supplied to metal $M_2$. Therefore, the hot junction generates heat and the temperature thereof rises to $T_H$. Taking the quantity of heat absorbed at the cold junction as $Q_C$, the quantity of heat generated at the hot junction as $Q_H$, the Peltier absorption energy as $Q_{PC}$, the Peltier emission energy as $Q_{PH}$, the Peltier absorption coefficient as $\Pi_c$, the Peltier emission coefficient as $\Pi_p$, the Joule heat generated in the thermoelectric semiconductor S as $P_r$, the temperature at the cold junction as $T_c$, the temperature at the hot junction as $T_H$, the ambient temperature as $T_R$, and the temperature difference between the hot junction and the cold junction as $\Delta T_s$, the relationships between these temperatures, thermal quantities, and the like, are expressed by the following equations.

$$Q_c = Q_{pc} - (1/2)P_r - \Delta T_s K \qquad (1.1)$$

$$Q_H = Q_{PH} + (1/2)P_r - \Delta T_s K \qquad (1.2)$$

$$Q_H - Q_C = (Q_{PH} - Q_{PC}) + P_r \qquad (1.3)$$

$$= \alpha \Delta T_s I + P_r \qquad (1.4)$$

$$Q_{PC} = \alpha T_c I = \Pi_c I \qquad (1.5)$$

$$\Pi_c = \alpha T_c \qquad (1.6)$$

$$Q_{PH} = \alpha T_H I = \alpha (T_c + \Delta T_s) I \qquad (1.7)$$

$$\Pi_p = \alpha T_H \qquad (1.8)$$

$$P_r = rI^2 \qquad (1.9)$$

$$\Delta T_s = T_H - T_c = T_R - T_c \qquad (1.10)$$

In these equations, (½) $P_r$ corresponds to the quantity of heat out of the Joule heat generated inside the thermoelectric semiconductor S which flow to the cold junction, and $\Delta T_s K$ corresponds to the quantity of heat out of the heat generated at the hot junction which flows to the cold junction. The formula $Q_H - Q_C$ shown in equation (1.3) gives the value of the electric power supplied externally to the element, and generally this is a positive value. This indicates that electric power is consumed in the element and remains in the element in the form of thermal energy.

In a conventional Peltier element, if an electric current continues to pass through the thermal insulating space, the temperature of the whole element will continue to rise, due to the thermal flow from the hot junction to the cold junction, and the generation and accumulation of heat at the hot junction. At the same time, since the temperature at the cold junction also rises, the element will lose its cooling function. Consequently, if this element is used in a cooling device, a heat diffusing device is essential in order to maintain a uniform temperature and suppress temperature rise at the hot junction due to accumulation of heat. Therefore, the overall dimensions and power consumption of the cooling element are increased.

SUMMARY OF THE INVENTION

It is an object of the present invention to provide a cooling device which is compact and has low power consumption.

It is a further object of the present invention to provide a light-emitting device whereby generation of heat can be suppressed.

It is yet a further object of the present invention to provide an efficient electric power extracting device.

The first aspect of the present invention provides a thermoelectric system comprising: a first thermoelectric semiconductor member having a cold end and a hot end; a first member connected to the cold end of the first thermoelectric semiconductor member, formed from a material wherein heat absorption occurs when first carriers comprising electrons or holes are injected from the first member into the first thermoelectric semiconductor member; and a light-emitting region formed from a semiconductor material, wherein light emission occurs due to recombination between electrons and holes by gathering of said first carriers transported to the hot end of said first thermoelectric semiconductor member.

At the cold end, heat absorption due to the Peltier effect occurs, for example. The energy of the carriers injected from the hot end to the light-emitting region are converted to light energy. Therefore, heat generation at the hot end is suppressed.

Moreover, it is possible to operate the system under conditions whereby the temperature at the hot junction does not rise, in which case the thermoelectric system as a whole is cooled. Consequently, even if the system is placed in a thermally insulated space, rather than creating overheating, a cooling effect can be obtained.

Moreover, the system according to the present invention may also combine cooling and light-emitting functions, thereby making it possible to emit light at low temperature without accompanying generation of heat. Consequently, it is possible to realize a device which outputs light energy without combined use of heat radiating apparatus.

DESCRIPTION OF THE PREFERRED EMBODIMENTS

The present inventor carried out detailed investigation of the operational principles of conventional Peltier elements. The content of their investigation is described below.

One of the causes behind accumulation of heat in a Peltier element and temperature rise at the hot junction thereof is the fact that thermal energy given up by the metal at the cold junction by means of electrons is introduced to the hot junction directly in its original form as thermal energy. In other words, thermal energy is lost from one place and moves to another place, and even if the first place is cooled locally, since in a closed thermal system, the thermal energy may increase, but it does not decrease (based on the first law of thermodynamics, i.e. the law of conservation of energy), accumulation of heat will inevitably occur at the other place.

If it were possible to convert the thermal energy into a different form of energy and discharge it outside the thermal system, then it would be possible to suppress the accumulation of heat. However, since thermal energy is regarded as a low-order form of energy which cannot be converted completely into a different energy form, there have been doubts regarding the possibility of this conversion. On the other hand, mechanical energy and electrical energy are seen as higher orders of energy which, unlike thermal energy, can be reciprocally converted, completely, provided that there is no friction or resistance.

Electrons in the Peltier element exceeding the potential barrier at the cold junction are regarded as being transported to the hot junction in a state where they have a sum of potential energy ($\Delta E_c$) and kinetic energy (2 kT). Therefore, it is envisaged that there is a sufficient possibility that this energy can be converted into a form other than thermal energy.

A further cause for temperature rise at the hot junction of a Peltier element is the fact that electrons having energy $Q_{PC}$ are injected into metal $M_2$ at the hot junction and these injected electrons collide with the metal lattice and give lattice vibration energy to the metal.

Consequently, the major technical problem involved in achieving the aforementioned objects lies in suppressing the generation of thermal energy at the hot junction, by converting the energy input to the hot junction to a higher order energy form other than thermal energy and by avoiding collision between electrons containing energy and the metal lattice.

Next, a description is given of the operational principles of a thermal device according to an embodiment of the present invention which resolves the aforementioned technical problem.

Figure 1A:
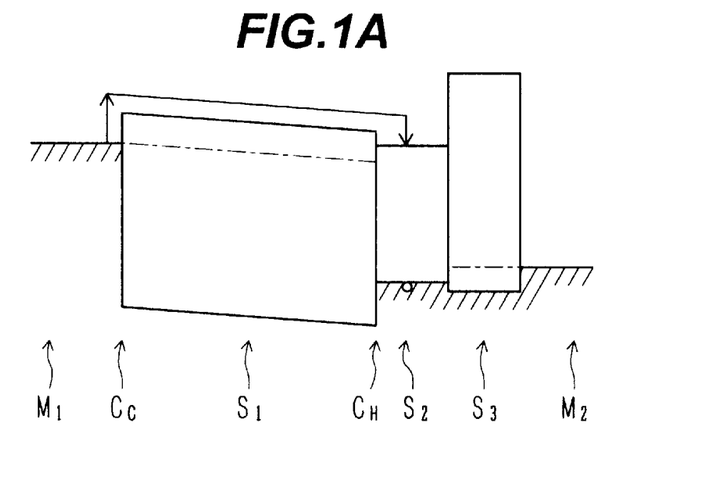
FIG. 1A is a band diagram of thermoelectric system according to an embodiment of the present invention and FIG. 1B is a thermoelectric equivalent circuit diagram thereof.

FIG. 1A is a band diagram of a thermal device according to an embodiment of the present invention. A metal $M_1$ is connected to a cold end (cold junction) of an n-type thermoelectric semiconductor $S_1$, and a semiconductor (light-emitting region) $S_2$ which produces light-emitting recombination of electrons and holes, a p-type semiconductor $S_3$ having a larger band-gap than the semiconductor $S_2$, and a metal $M_2$, are connected, in this order, to the hot end (hot junction) $C_H$ thereof.

In the cooling device shown in FIG. 1A, semiconductor $S_2$ is used in place of metal $M_2$ at the hot junction of the conventional Peltier element shown in FIG. 7. By using semiconductor $S_2$, it is possible to convert energy transported by electrons from the cold junction into light energy at the hot junction $C_H$. Specifically, rather than converting all the energy of the electrons transported to the hot junction $C_H$ into thermal energy, it is converted into light energy by band-to-band transition.

Figure 1B:
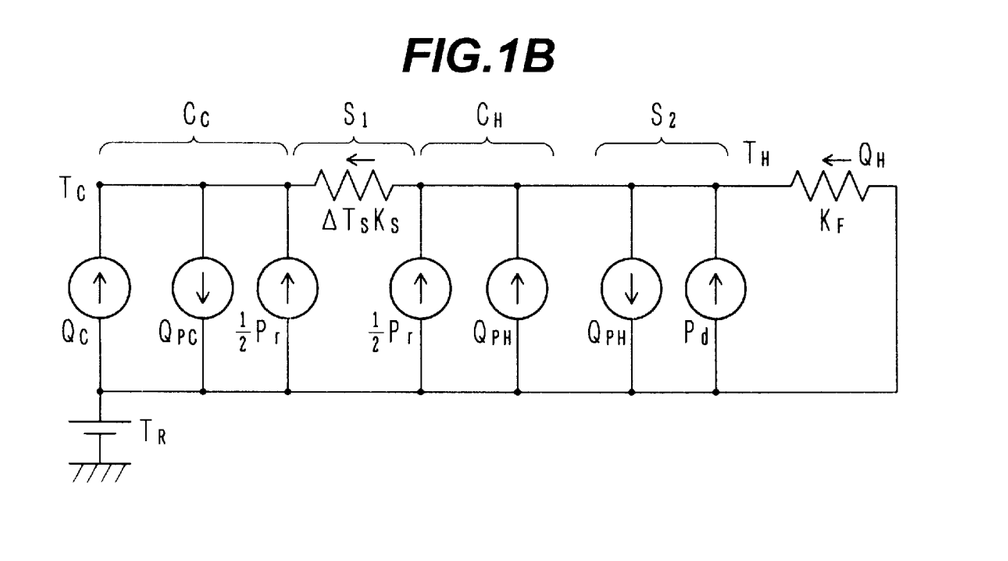

FIG. 1B shows an equivalent thermoelectric circuit diagram which represents the thermal effects generated in the cooling device shown in FIG. 1A by means of an equivalent electrical circuit. In this equivalent circuit, the flow of thermal energy is equivalent to electric current, the temperature difference is equivalent to voltage, and the thermal conductivity is equivalent to electrical conductance. The equivalent circuit from the cold junction $C_C$ to the hot junction $C_H$ was determined by a thermal flow equation for a conventional thermoelectric cooling element. Moreover, the equivalent circuit for the semiconductor (light-emitting region) $S_2$ was determined from the following equation, which relates to the light output energy of a light-emitting element. Namely, $$Q_L = (Q_E - Pd) \qquad (2.1)$$

$$= (Q_{PH} - Pd) \qquad (2.2)$$

Here, $Q_L$ is output light energy; $Q_E$ is the electrical energy input to the light-emitting region $S_2$; and Pd is the thermal loss. In the light-emitting region $S_2$, the electrical energy $Q_E$ is equivalent to the Peltier emission energy $Q_{PH}$.

The thermal source $Q_C$ at the cold junction $C_C$ represents the heat absorbed from outside, the thermal source $Q_{PC}$ represents Peltier absorption energy, and $(½)P_r$ represents half the Joule heat generated in the thermoelectric semiconductor $S_1$. In other words, it is assumed that half the Joule heat generated in the thermoelectric semiconductor $S_1$ is transported to the cold junction $C_C$. $K_s$ represents the thermal conductivity of the thermoelectric semiconductor $S_1$; $\Delta T_s$ is the temperature difference between the temperature $T_H$ at the hot junction $C_H$ and the temperature $T_C$ at the cold junction $C_C$, and $\Delta T_s K_s$ is the quantity of heat flowing to the cold junction $C_C$ from the hot junction $C_H$ due to thermal conduction.

The thermal source $Q_{PH}$ at the hot junction $C_H$ represents the Peltier emission energy, and $(½)P_r$ represents the Joule heat flowing to the hot junction. The thermal source $Q_{PH}$ of the light-emitting region $S_2$, corresponds to the Peltier emission energy flowing to the light-emitting region $S_2$, and a portion of this energy is discharged as light energy. The thermal source $P_d$ represents thermal loss generated by the light-emitting region $S_2$, where energy equal to ($Q_{PH}-P_d$) is converted to light and discharged outside the element. $K_F$ is the thermal conductivity between the hot junction $C_H$ and the ambient air, $T_R$ is the ambient air temperature, and $Q_H$ is the quantity of heat flowing into the ambient air from the hot junction $C_H$.

If the equivalent circuit in FIG. 1B is represented by basic thermal flow equations, then the following equations are obtained. Here, $P_{IN}$ represents the input electrical power.

$$Q_H = Q_{PH} + (1/2)P_r - \Delta T_s K_s - (Q_{PH} - P_d) \qquad (2.3)$$

$$Q_C = Q_{PC} - (1/2)P_r - \Delta T_s K_s \qquad (2.4)$$

$$Q_H - Q_C = (Q_{PH} - Q_{PC}) + P_r - (Q_{PH} - P_d) \qquad (2.5)$$

$$= \alpha \Delta T_s I + P_r - Q_L \qquad (2.6)$$

$$P_{IN} = \alpha \Delta T_s I + P_r \qquad (2.7)$$

$$P_r = rI^2 \qquad (2.8)$$

$$\Delta T_s = (T_R - T_C) + (Q_H / K_F) \qquad (2.9)$$

$$T_H = T_R + (Q_H / K_F) \qquad (2.10)$$

If the electric-to-optical conversion efficiency of the light-emitting region $S_2$ rises and the thermal loss $P_d$ is reduced, the quantity of heat $Q_H$ generated at the hot junction $C_H$ will decline. If $Q_H$ becomes negative, then the temperature of the hot junction $C_H$ will fall below the ambient temperature. In this case, the thermal flow $Q_H$ between the ambient air and the hot junction $C_H$ will flow reversed and heat will flow from the ambient air to the element. If the thermal loss Pd is high and the quantity of heat generated at the hot junction $C_H$ is large, then the thermal flow $Q_H$ will be from the element into the ambient air.

Equations (2.3) and (2.5), which respectively express the quantity of heat QH generated and the power $Q_H-Q_C$ consumed at the hot junction $C_H$, become equations (1.1) and (1.3) relating to a conventional device if the ($-(Q_{PH}-P_d)$) elements are removed. Moreover, equation (2.9), which expresses the temperature difference between the cold junction $C_C$ and the hot junction $C_H$, becomes equation (1.10) relating to a conventional device, if the thermal conductivity $K_F$ is taken as infinity. Taking the thermal conductivity as infinity indicates that there is no temperature difference between the ambient air and the hot junction $C_H$, and the temperature $T_H$ of the hot junction is maintained at a uniform ambient temperature $T_R$. It also signifies that a state of equilibrium exists between the quantity of heat $Q_C$ given up by the cold junction $C_C$ and the quantity of heat $Q_H$ discharged into the ambient air at the hot junction $C_H$.

In equation (2.3), the fourth element on the right-hand side ($Q_{PH}-P_d$) represents the amount of the energy $Q_{PH}$ in the electrons arriving at the hot junction $C_H$ that is converted to light energy. When expressed using the electric-to-optical conversion efficiency $\eta_L$, this element ($Q_{PH}-P_d$) becomes $\eta_L Q_{PH}$. A negative sign indicates that energy is generated and signifies that it is emitted outside the element from the hot junction $C_H$ in the form of light energy.

This shows that the quantity of heat emitted as light can be made larger than the applied power $P_{IN}$ injected from outside the element. In other words, it means that the temperature $T_H$ of the hot junction $C_H$ can be made lower than the temperature of the ambient air temperature $T_R$. This is a decisive difference from conventional elements. Here, since the cold junction $C_C$ and light-emitting region $S_2$ are connected in series, an equal current flows through each section and layer thereof. Consequently, the amounts of energy moving per unit surface area per unit time due to electrons flowing through the cold junction $C_C$ and electrons transited from the conduction band to the valence band in the light-emitting region $S_2$ are the same.

In equation (2.5) which expresses power consumption, the negative sign of the third element $(Q_{PH}-P_d)$ on the right-hand side indicates that energy is generated inside the element, similarly to the fourth element of equation (2.3). Specifically, it means that when input power $((Q_{PH}-Q_{PC})+P_r)$ is applied, a portion of the Peltier emission energy $Q_{PH}$ is emitted as light energy $(Q_{PH}-P_d)$ and discharged from the element.

Generally, since the Peltier emission energy $Q_{PH}$ can be made larger than the input power, it is possible to achieve negative power consumption (2.5). In other words, it is possible to extract energy from the element. The energy extracted from the element corresponds to the energy lost inside the element. In this way, the total amount of energy in this thermal system (system including cooling element and light discharge space) remains constant, satisfying the law of conservation of energy.

In order to design a cooling device, the aforementioned basic thermal flow equations (2.3)–(2.10) can be rearranged by inserting the thermoelectric element parameters, to give the following expressions.

$$Q_H = -\Pi_c I[(E_G/\Pi_c)\eta_L + (\Delta T_s K_s/\Pi_c I) - \{(rI/2\Pi_c) + (E_G/\Pi_c)\}] \quad (3.1)$$

$$Q_C = \Pi_c I\{1 - (rI/2\Pi_c) - (\Delta T_s K_s/\Pi_c I)\} \quad (3.2)$$

Here, $\Pi_c$ is the Peltier absorption coefficient, $E_G$ is the band gap of the light-emitting region $S_2$, $\eta_L$ is the electric-to-optical conversion efficiency of the light-emitting region $S_2$, and I is the current flowing in the element.

From equation (3.1), in order to achieve a negative quantity of heat $Q_H$ generated at the hot junction $C_H$, it is necessary to have both a high Peltier absorption coefficient $\Pi_c$, and a high electric-to-optical conversion efficiency $\eta_L$ and thermal conductivity $K_s$. On the other hand, if the thermal conductivity $K_s$ is too high, then as indicated by equation (3.2), the quantity of heat $Q_C$ absorbed will become too small and performance will decline. In a conventional thermoelectric cooling device, the smaller the value of the thermal conductivity $K_s$, the better the performance, but in the cooling device according to the present embodiment, it can be seen that an optimum value exists.

Next, an embodiment based on the foregoing operational principles is described.

Figure 2:
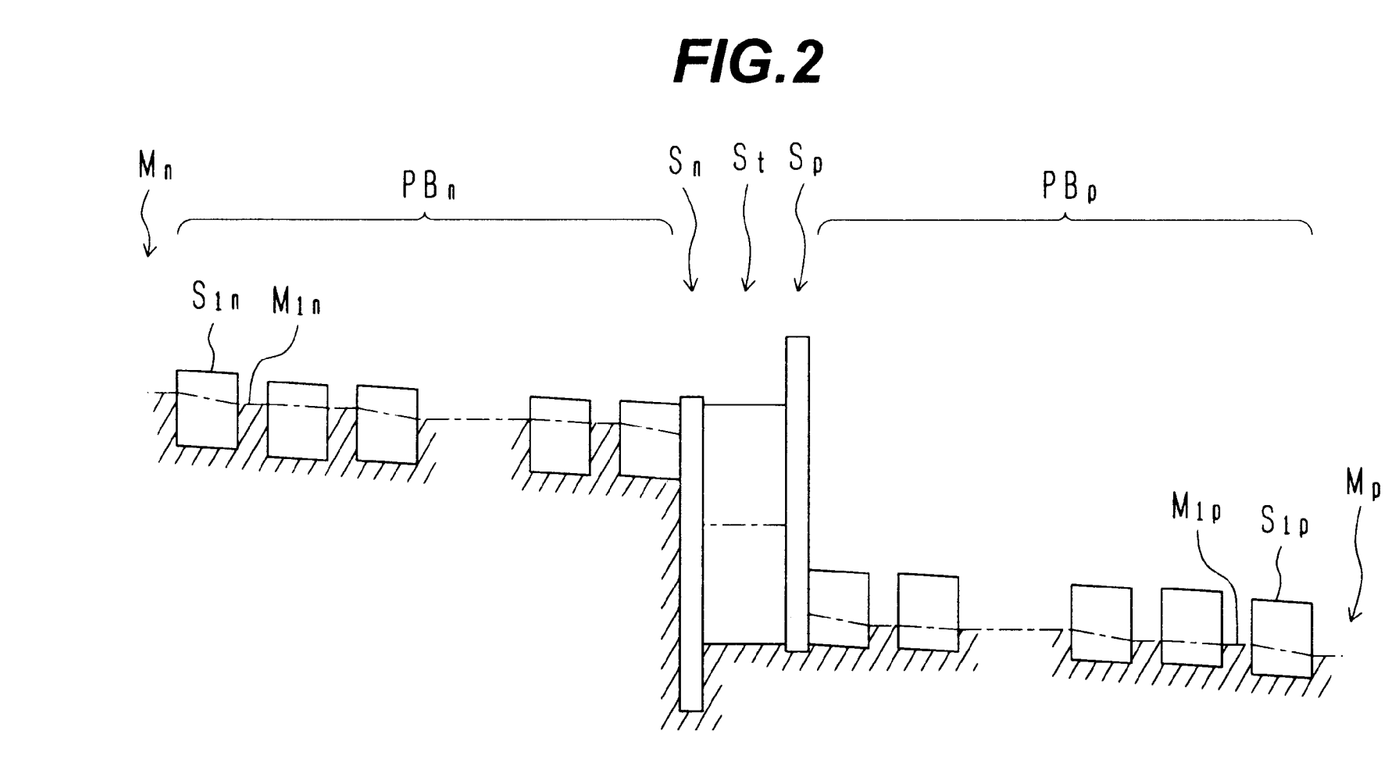
FIG. 2 is a band diagram of a light-emitting device according to an embodiment of the present invention.

FIG. 2 shows a band diagram of a thermoelectric system according to an embodiment. The thermoelectric system in this embodiment comprises: an n-side metal $M_n$; an n-type Peltier laminated structure $PB_n$; a buffer layer $S_n$ made from an n-type semiconductor; a light-emitting region $S_t$; a buffer layer $S_p$ made from a p-type semiconductor; a p-type Peltier laminated structure $PB_p$; and p-side metal $M_p$; these elements being laminated together in this order. The junction between the n-side metal $M_n$ and the n-type Peltier laminated structure $PB_n$ and the junction between the p-side metal $M_p$ and the p-type Peltier laminated structure $PB_p$ correspond to the cold junction $C_C$ shown in FIG. 1A. Furthermore, the junction between the light-emitting region $S_t$ and the n-type Peltier laminated structure $PB_n$ and the junction between the light-emitting region $S_t$ and the p-type Peltier laminated structure $PB_p$ correspond to the hot junction $C_H$ shown in FIG. 1A.

The n-type Peltier laminated structure $PB_n$ is constituted by laminating alternate layers of an n-type thermoelectric semiconductor $S_{1n}$ and a metal $M_{1n}$. For example, it may be constituted by 10 layers of n-type thermoelectric semiconductor $S_{1n}$ and 9 layers of metal $M_{1n}$. The p-type Peltier laminated structure $PB_p$ is constituted by laminating alternative layers of a p-type thermoelectric semiconductor $S_{1p}$ and a metal $M_{1p}$. For example, it may be constituted by 10 layers of p-type thermoelectric semiconductor $S_{1p}$ and 9 layers of metal $M_{1p}$.

The n-type thermoelectric semiconductor $S_{1n}$ and the p-type thermoelectric semiconductor $S_{1p}$ are respectively, for example, n-type PbTe layers and p-type PbTe layers of approximately 50 $\mu$m thickness and 1×1 mm$^2$ surface area. The metal layers $M_{1n}$ and $M_{1p}$ are, for example, Au layers of 5 $\mu$m thickness. The n-type buffer layer $S_n$ and the p-type buffer layer $S_p$ are respectively, for example, an n-type InP layer and a p-type InP layer approximately 2 $\mu$m thick. The light-emitting region $S_t$ is, for example, an InGaAsP layer having a band gap of 1.25 eV.

The n-type buffer layer $S_n$ relaxes lattice mismatching between light-emitting region $S_t$ and the layer of n-type thermoelectric semiconductor $S_{1n}$ which is nearest to the light-emitting region $S_t$. Similarly, the p-type buffer layer $S_p$ eases lattice mismatching between the light-emitting region $S_t$ and the layer of p-type thermoelectric semiconductor $S_{1p}$ nearest to the light-emitting region $S_t$. By providing these buffer layers $S_n$ and $S_p$, the carrier injection efficiency into the light-emitting region $S_t$ and the light emission efficiency of the light-emitting region are increased. Consequently, the thermal loss at the hot junctions is reduced and the thermoelectric performance of the light-emitting device is raised.

Moreover, the n-type buffer layer $S_n$ forms a potential barrier with respect to holes injected from the p-type Peltier laminated structure $PB_p$ into the light-emitting region $S_t$, and hence it suppresses leakage of holes into the n-type Peltier laminated structure $PB_n$. Similarly, the p-type buffer layer $S_p$ forms a potential barrier for electrons injected from the n-type Peltier laminated structure $PB_n$ into the light-emitting region $S_t$, and it therefore suppresses leakage of electrons into the p-type Peltier laminated structure $PB_p$. Consequently, the carriers accumulate in the light-emitting region $S_t$, thereby raising the probability of carrier recombination.

The total quantity of heat absorbed at the cold junction on the side of the n-type Peltier laminated structure $PB_n$ and the cold junction on the side of the p-type Peltier laminated structure $PB_p$ is the sum of the quantity of heat absorbed due to the n-type electrons and the quantity of heat absorbed due to the p-type holes. Therefore, the quantity of heat absorbed can be doubled compared to the case of heat absorption due to electrons alone, or heat absorption due to holes alone.

Furthermore, in the thermoelectric system illustrated in FIG. 2, the n-type Peltier laminated structure $PB_n$ and p-type Peltier laminated structure $PB_p$ both have 10 Peltier barriers connected in series. Therefore, it can be seen that the energy absorbed at each Peltier barrier additionally accumulates and hence the Peltier absorption energy at the final stage of the hot junction is large (for example, multiplied ten-fold). In this way, it is possible to compose a thermoelectric system wherein the effective Peltier coefficient $\Pi_c$ is made large, so that the conditions for achieving a negative quantity of heat $Q_H$ generated at the hot junction, as expressed by equation (3.1), are satisfied.

In the light-emitting device shown in FIG. 2, taking the composite resistance of the thermoelectric semiconductor as r, the current as I, the effective Peltier absorption coefficient as $\Pi_c$, the temperature difference between the hot junction and cold junction as $\Delta T_s$ and the thermal conductivity of the n-type and p-type Peltier laminated structures $PB_n$ and $PB_p$ as $K_s$, then each material is composed such that the equation $$[1-(rI/2\Pi_c)] > -(\Delta T_s K_s / \Pi_c I)$$

is satisfied, and current is passed through the device. By satisfying these conditions, the quantity of heat $Q_c$ absorbed at the cold junctions according to equation (3.2) becomes positive, thereby making it possible to provide a cooling function.

The Peltier absorption coefficients of the respective carriers in the n-type Peltier laminated structure $PB_n$ and the p-type Peltier laminated structure $PB_p$ are designed so that they are half the energy gap $E_G$ of the light-emitting region $S_t$. Thereby, the potential energy of the electrons will be equal to the energy gap $E_G$. Electrons injected into the light-emitting region $S_t$ transit directly from the conduction band to the valence band thereof, and light of a wavelength corresponding to the band gap $E_G$ is discharged, thereby losing energy. Consequently, lattice collisions are avoided and the generation and accumulation of heat at the hot junctions can be suppressed.

The various thermoelectric parameters of the thermoelectric device illustrated in FIG. 2 are as follows.
PbTe thermoelectric constant Specific resistance: $\rho = 1.15 \times 10^{-3}$ ($\Omega \cdot$cm)

Thermal conductivity: $\chi = 1.79 \times 10^{-2}$ (W/K·cm)

Seebeck coefficient (n-type): $S = 250$ ($\mu$V/K)

Thermoelectric parameters of single-layer Peltier barrier element of 50 $\mu$m length and 1 mm$^2$ surface area Element length: $l_o = 50$ ($\mu$m)

Surface area: $A = 1$ (mm$^2$)

Seebeck coefficient: $S = 250$ ($\mu$V/K)

Resistance: $r_o = 5.75 \times 10^{-4}$ ($\Omega$)

Thermal conductivity: $k_o = 3.58 \times 10^{-2}$ (W/K)

Effective thermoelectric parameters of multiple-layer Peltier barrier element

Effective Seebeck coefficient: $\alpha = 2.5 \times 10^{-3}$ (V/K)

Effective thermal conductivity: $K_s = 0.358$ (W/K)

Effective resistance: $r = 0.575 \times 10^{-2}$ ($\Omega$)

Number of layers: $N = 10$

Element length: $L = 0.5$ (mm)

Surface area: $A = 1$ (mm$^2$)

Here, the effective Seebeck coefficient $\alpha$ of the multiple-layer Peltier barrier element is effectively 10 times that of a single element ($S = 250$ $\mu$V/K) of the same element length and surface area, and it has a value in the mV order. Therefore, the Peltier coefficient is also 10 times larger. The thermal conductivity and resistance are also effectively 10 times larger.

The effective thermal conductivity Ks is very significant with regard to the operation of the light-emitting device. In other words, if insufficient of the amount of heat generated at the hot junction can be discharged as light energy (the electric-to-optical conversion efficiency $\eta_L$ of the light-emitting region $S_t$ is low) and a negative value cannot be achieved for the quantity of heat $Q_H$ generated, then the effective thermal conductivity $K_s$ is increased and the heat generated at the hot junction will return to the cold junction. In this way, it will serve to reduce the temperature of the hot junction. In a conventional thermoelectric cooling element, if the thermal conductivity $K_s$ is high, then the quantity of heat flowing into the cold junction will rise and the amount of heat $Q_c$ absorbed and the Coefficient of performance (COP) will decline, and therefore it has been considered desirable to lower the value of $K_s$. On the other hand, in the present embodiment, it is not necessarily desirable to reduced thermal conductivity $K_s$, but rather an optimum range exists for $K_s$.

Next, performance is evaluated in a thermoelectric system comprising only an n-type region consisting of an n-type Peltier multiple-layer structure $PB_n$ and a light-emitting region $S_t$.

Here, a case is considered where this thermoelectric system is operated under conditions of: input power $P_{IN} = 16.5$ mW, current $I = 1$A, thermal conductivity between hot junction and ambient air $K_F = 4.73 \times 10^{-3}$ (W/K), electric-to-optical conversion efficiency of light-emitting region $S_t$ $\eta_E = 80\%$ and ambient temperature $T_R = 300$K.

The band gap $E_G$ in equations (3.1), (3.2) is taken as ($\frac{1}{2}$)$E_G$, and by substituting the aforementioned conditions and thermoelectric parameters, the following thermoelectric cooling performance is obtained.

| | |
|---|---|
| Coefficient of performance | COP = 32 |
| Quantity of heat absorbed | $Q_C$ = 529 (mW) |
| Quantity of heat generated at hot junction | $Q_H$ = −454 (mW) |
| Temperature of cold junction | $T_C$ = 250 (K) |
| Temperature of hot junction | $T_H$ = 251 (K) |
| Light output | $P_L$ = 1 (W) |

In this way, the temperature $T_H$ of the hot junction is 251 K, which is 50K lower than the ambient temperature, the quantity of heat $Q_C$ absorbed is 529 mW, and the coefficient of performance is 32 (3200%). On the other hand, a conventional semiconductor Peltier element fitted with a ventilating fan has a COP of 100% or less, a domestic air conditioner has a COP of 2–3 (200–300%), and a cooling tower, or the like, comprising heat diffusion apparatus based on water cooling, has a COP of approximately 15 (1500%). Furthermore, in the thermoelectric system according to the present embodiment, in addition to the cooling function, output light of 1 W was obtained.

The negative sign of the quantity of heat $Q_H$ generated at the hot junction indicates that the thermal flow is from the ambient air into the hot junction, and this signifies that the temperature $T_H$ of the hot junction is lower than the ambient temperature $T_R$. The effect whereby the quantity of heat $Q_H$ emitted by the hot junction becomes negative is brought about by the fact that a portion of the heat absorption energy $Q_{PC}$ given up at the cold junction is discharged from the hot junction in the form of light energy ($Q_{PH} - P_d$) and, moreover, the heat generated at the hot junction passes through the n-type Peltier laminated structure $PB_n$ and returns to the cold junction.

Accordingly, there is a fall in the temperature of the whole element including the cold junction and hot junction. If the thermal conductivity $K_F$ between the hot junction and the ambient air is zero, in other words, if the hot junction is completely isolated thermally from the ambient air, then the second element on the right-hand side of equation (2.10) ($Q_H / K_F$) becomes minus infinity, and the temperature $T_H$ of the hot junction approaches absolute zero.

In a conventional element, the quantity of heat $Q_H$ generated at the hot junction is positive, and the temperature of the hot junction is always higher than the ambient temperature. Therefore, the heat at the hot junction is discharged into the ambient air by means of a ventilating fan, or the like. In other words, the Peltier emission energy $Q_{PH}$ is discharged. The temperature $T_H$ of the hot junction never becomes lower than the ambient temperature, even if the thermal conductivity $K_F$ between the hot junction and the ambient air due to the ventilating fan is made infinitely large. Since a ventilating fan is required, the power consumption of the element is high.

Desirably, there is a small temperature difference $\Delta T_s$ between the cold junction and the hot junction. If this temperature difference $\Delta T_s$ is made small, then it is possible to reduce the power supplied $P_{IN}$, in accordance with equation (2.7).

By means of the present embodiment, a high COP is achieved, and moreover, a device which combines both a cooling function and a light-emitting function can be realized. Furthermore, since heat diffusion is not necessary, it is possible to avoid increase in the volume of the system, and the like, due to the presence of a ventilating fan.

Next, the relationship between the foregoing embodiment and the second law of thermodynamics will be discussed.

The energy and entropy generated by the present device cannot be defined as an open relationship where there is unlimited inflow and output of heat. Therefore, the effective energy and the entropy generated in the present device, when it is placed in a thermally insulated system U, are determined, and they indicate that the system does not contradict the second rule of thermodynamics.

Let it be assumed that no heat whatsoever flows into or out from the thermally insulated system U. The initial thermal energy of the thermally insulated system U when the present device is not operating is taken as $Q_{TO}$ and the temperature of the system U at this time is taken as $T_{UO}$. The initial electrical energy of the thermally insulated system U is taken as $P_o$.

If electrical energy $P_o$ is applied to the present device, the device starts operation and it absorbs thermal energy $Q_{CH}$ from system U having thermal energy $Q_{TO}$ and it emits light energy $Q_L$. Therefore, the thermal energy of system U falls from $Q_{TO}$ to $(Q_{TO}-Q_{CH})$, and the temperature of system U falls from $T_{UO}$ to $T_U$. On the other hand, the light energy $Q_L$ is converted to effective energy $Q_{ES}$ and thermal energy $Q_{TS}$, of which the thermal energy $Q_{TS}$ is discharged, and therefore the thermal energy $Q_{TU}$ of the thermally insulated system U comprises energy $Q_{TS}$ added to $(Q_{TO}-Q_{CH})$. Effective energy means energy which can be used to achieve work of some kind, for instance, electrical energy, or the like.

The relationships between the thermal energy $Q_{TU}$ and temperature $T_U$ of the thermally insulated system U, and the effective energy $Q_{ES}$ and thermal energy $Q_{TS}$ converted from the light energy $Q_L$ are given by the following equations.

Thermal energy of thermally insulated system U:

$$Q_{TU}=(Q_{TO}-Q_{CH})+Q_{TS} \quad (4.1)$$

Temperature of thermally insulated system U:

$$T_U=\{(Q_{TO}-Q_{CH})+Q_{TS}\}/C_U \quad (4.2)$$

Light energy output by device:

$$Q_L=Q_{CH}+P_o \quad (4.3)$$

Converted energy:

$$=Q_{ES}+Q_{TS} \quad (4.4)$$

Specific heat of thermally insulated system U:

$$C_u=Q_{TO}/T_{UO} \quad (4.5)$$

Thermal energy input into device:

$$Q_{CH}=Q_{RC}+Q_{RH} \quad (4.6)$$

Here, $Q_{RC}$: Thermal energy flowing into cold junction $Q_{RH}$: Thermal energy flowing into hot junction and light-emitting region $Q_{ES}$: Effective energy obtained by converting light energy $Q_L$ If equations (4.1)–(4.5) are rearranged by inserting thermal equilibrium conditions ($Q_{TU}=Q_{CH}$; $T_U=T_C$), and conversion loss of zero or above ($Q_{TS} \geq 0$), then following equations are obtained for the light energy $Q_L$, effective energy $Q_{ES}$ and thermal energy $Q_{TS}$ in a state of thermal equilibrium.

$$Q_{ES}=Q_{TO}\{1-(T_C/T_{UO})\}+P_o \quad (4.7)$$

$$Q_{TS}=Q_{TO}\{1-2(1-(T_C/T_{UO}))\} \quad (4.8)$$

$$Q_L=Q_{TO}(T_C/T_{UO})+P_o \quad (4.9)$$

$$(T_C/T_{UO}) \geq (\tfrac{1}{2}) \quad (4.10)$$

The above equations indicate the relationships between energy and temperature obtained when the temperature $T_U$ of the thermally insulated system U matches the device temperature $T_C$, the thermal energy $Q_{TU}$ of the thermally insulated system U matches the thermal energy $Q_{CH}$ absorbed by the present device, and the present device has stopped work. Specifically, this means that energy above these levels cannot be generated.

In equations (4.8)–(4.10), when the temperature $T_C$ of the device is half the initial temperature $T_{UO}$ of the system U, namely, when $(T_C/T_{UO})=(\tfrac{1}{2})$, then as shown in the following equations, the effective energy $Q_{ES}$ has a maximum value, $(Q_{TO}/2)+P_o$, the thermal energy $Q_{TS}$ becomes zero, and the light energy $Q_L$ has a maximum value, $(Q_{TO}/2)+P_o$. These values represent boundary limits which the energy values cannot exceed. When this is expressed as an equation, the following is obtained.

$$(Q_{ES})_M=(Q_{TO}/2)+P_o \quad (4.11)$$

$$(Q_{TS})_M=0 \quad (4.12)$$

$$(Q_L)_M=(Q_{TO}/2)+P_o \quad (4.13)$$

$$(T_C/T_{UO}) \geq (\tfrac{1}{2}) \quad (4.14)$$

Here, $(\ )_M$ represents a maximum value.

These equations indicate that all of the light energy $Q_L$ discharged can be converted to effective energy $Q_{ES}$, and that half of the thermal energy $Q_{TO}$ of the system U can be converted to effective energy $Q_{ES}$. This $Q_{ES}$ is energy which can be accumulated, but which does no work in its accumulated state.

On the other hand, if the device temperature matches the initial temperature of the system U ($(T_C/T_{UO})=1$), then the effective energy $Q_{ES}$ is zero, the thermal energy $Q_{TS}$ is the initial energy $Q_{TO}$, and the light energy $Q_L$ is equal to $Q_{TO}+P_o$. This means that all of the light energy $Q_L$ discharged is converted to initial thermal energy $Q_{TO}$, and there is no effective energy $Q_{ES}$ at all in the system U.

From the above, there is a limit on the effective energy $Q_{ES}$ generated by the present device in the thermally insulated system U, and work cannot be done perpetually. In other words, the present device is not a perpetual machine.

Figure 8A:
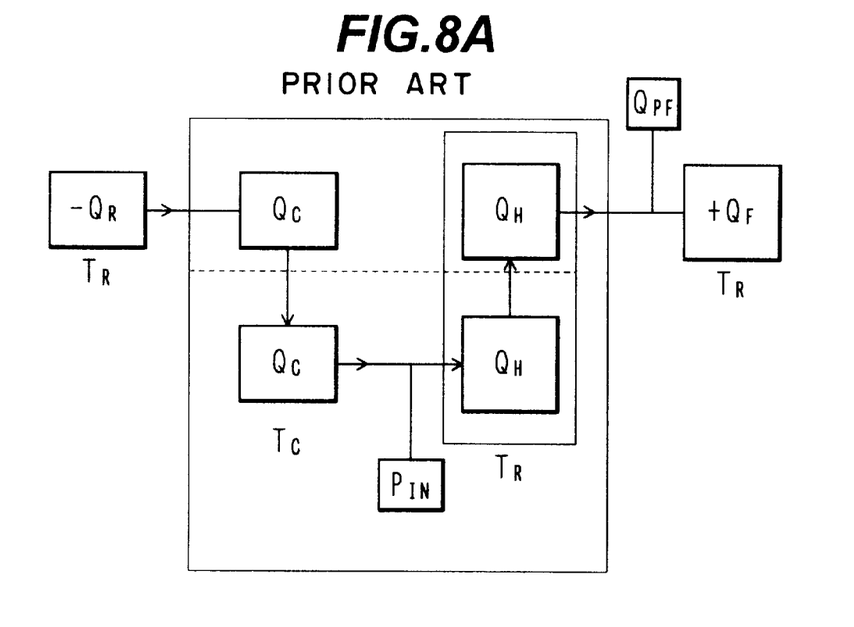
FIG. 8A and FIG. 8B are block diagrams of a thermoelectric system according to the prior art and an embodiment of the present invention, respectively.
Figure 8B:
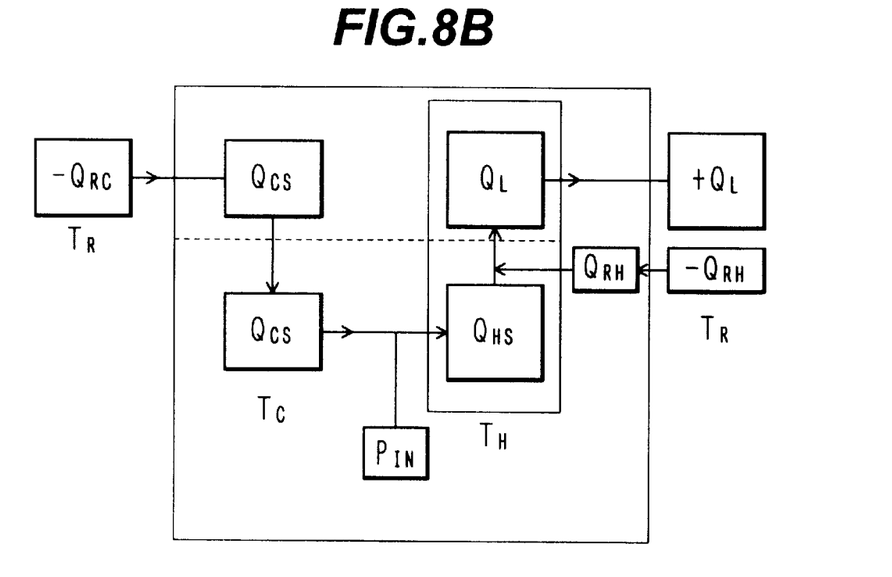

FIG. 8A and FIG. 8B are block diagrams of a conventional thermoelectric cooling element and the present device, respectively. These diagrams show the parts constituting the elements, the thermal energy flowing in and out of each part and the temperature of each part. In the conventional element, a heat diffusing device (ventilating fan, or the like) is provided for discharging the thermal energy $Q_H$ at the hot junction, and since this heat diffusing device usually has an efficiency of several 10%, it generates new thermal energy $Q_{PF}$ in addition to $Q_F$. Therefore, thermal energy of $Q_F$ and $Q_{PF}$ is discharged into the ambient air.

The cooling plates, cold junctions and hot junctions constituting the present device operate similarly to corresponding parts in a conventional element. Furthermore, the light-emitting region of the present device corresponds to the heat diffusing device in a conventional element.

When electric power $P_{IN}$ is applied, the thermal energy $Q_{RC}$ in the ambient air flows from the cooling plate to the cold junction of the element and the thermal energy $Q_{CS}$ at the cold junction is transported to the hot junction. At the hot junction, Peltier emission energy is discharged as light energy $Q_L$ from the light-emitting region, in addition to which thermal energy $\Delta T_K$ flows back to the cold junction, and therefore the quantity of heat $Q_H$ emitted by the hot junction becomes negative. Therefore, thermal energy $Q_{RH}$ is also supplied from the ambient air to the hot junction and light-emitting region.

The entropy generated between the constituent parts of the device are expressed by the following equations. Energy flowing in has a positive sign and energy flowing out has a negative sign. Here, $\Delta S_{RC}$ is the entropy generated between the ambient air and the cooling plate, $\Delta S_{CC}$ is the entropy generated between the cooling plate and the cold junction, $\Delta S_{CH}$ is the entropy generated between the cold junction and the hot junction, $\Delta S_{RH}$ is the entropy generated between the ambient air and the hot junction, $\Delta S_{HL}$ is the entropy generated between the hot junction and the light-emitting region, and $\Delta S_{LL}$ is the entropy generated between the light-emitting region and the ambient air.

$$\Delta S_{RC} = (-Q_{RC}/T_R) + (Q_{CS}/T_C) \quad (4.15)$$

$$\Delta S_{CC} = (-Q_{CS}/T_C) + (Q_{CS}/T_C) \quad (4.16)$$

$$\Delta S_{CH} = (-Q_{CS}/T_C) + (Q_{HS}/T_H) \quad (4.17)$$

$$\Delta S_{RH} = (-Q_{RH}/T_R) + (Q_{RH}/T_H) \quad (4.18)$$

$$\Delta S_{HL} = \{(-(Q_{HS}+Q_{RH})/T_H\} + (Q_L/T_H) = 0 \quad (4.19)$$

$$\Delta S_{LL} = (-Q_L/T_H) + (Q_L/T_R) \quad (4.20)$$

The entropy $\Delta S_{RL}$ generated by the process in the present device of converting thermal energy absorbed from the ambient air into light is the sum of the entropies generated between each constituent part and it is expressed by the following equation.

$$\Delta S_{RL} = \Delta S_{RC} + \Delta S_{CC} + \Delta S_{CH} + \Delta S_{RH} + \Delta S_{HL} + \Delta S_{LL} \quad (4.21)$$

$$= \{Q_L - Q_{CH}\}/T_R \quad (4.22)$$

$$Q_{CH} = (Q_{RC} + Q_{RH}) \quad (4.23)$$

$$Q_L = Q_{CH} + P_{IN} \quad (4.24)$$

If all of the light energy $Q_L$ is converted to thermal energy by using it to do work, then $(Q_L - Q_{CH}) = P_{IN}$, and therefore the entropy generated by the present device will have a positive value as shown below.

$$\Delta S_{RL} = P_{IN}/T_R \quad (4.25)$$

On the other hand, if not all of the light energy $Q_L$ is converted to heat, then $(Q_L - Q_{CH}) \leq 0$, and the entropy will have a negative value. However, this state is a "state where the light energy $Q_L$ does no work", in other words, a state where the entropy is negative locally, and this local state of negative entropy occurs normally and is not inconsistent with the "second law of thermodynamics".

Furthermore, in the present device as described in Table 1, in principle there is the possibility of converting half of the thermal energy $Q_{TO}$ in the system U to effective energy, in contrast to a conventional cooling device, where the effective energy is zero. The entropy generated in the present device is less than that in a conventional element. Incidentally, the thermal energy $Q_{TO}$ on the earth, including radiated heat energy, is always increasing and has a huge value, so this can be seen as providing energy free of charge.

TABLE 1

| | Present device | Conventional cooling element |
| --- | --- | --- |
| Effective energy limit{ $(Q_{ES})_M$} | $(Q_{TO}/2) + P_O$ | 0 |
| Entropy generated | $P_{IN}/T_R$ | $(P_{IN}/T_R) + (Q_{PF}/T_R)$ |
| Hot Junction temperature | $T_H \leq T_R$ | $T_H = T_R$ |
| Discharged energy | Light, electricity | Heat |

Above, by investigating the effective energy and the entropy generated in a thermally insulated system U, it was seen that the present device is not a perpetual device, but rather it generates positive entropy, and it was also seen that the principle of the present device satisfies "the second law of thermodynamics".

Figure 3:
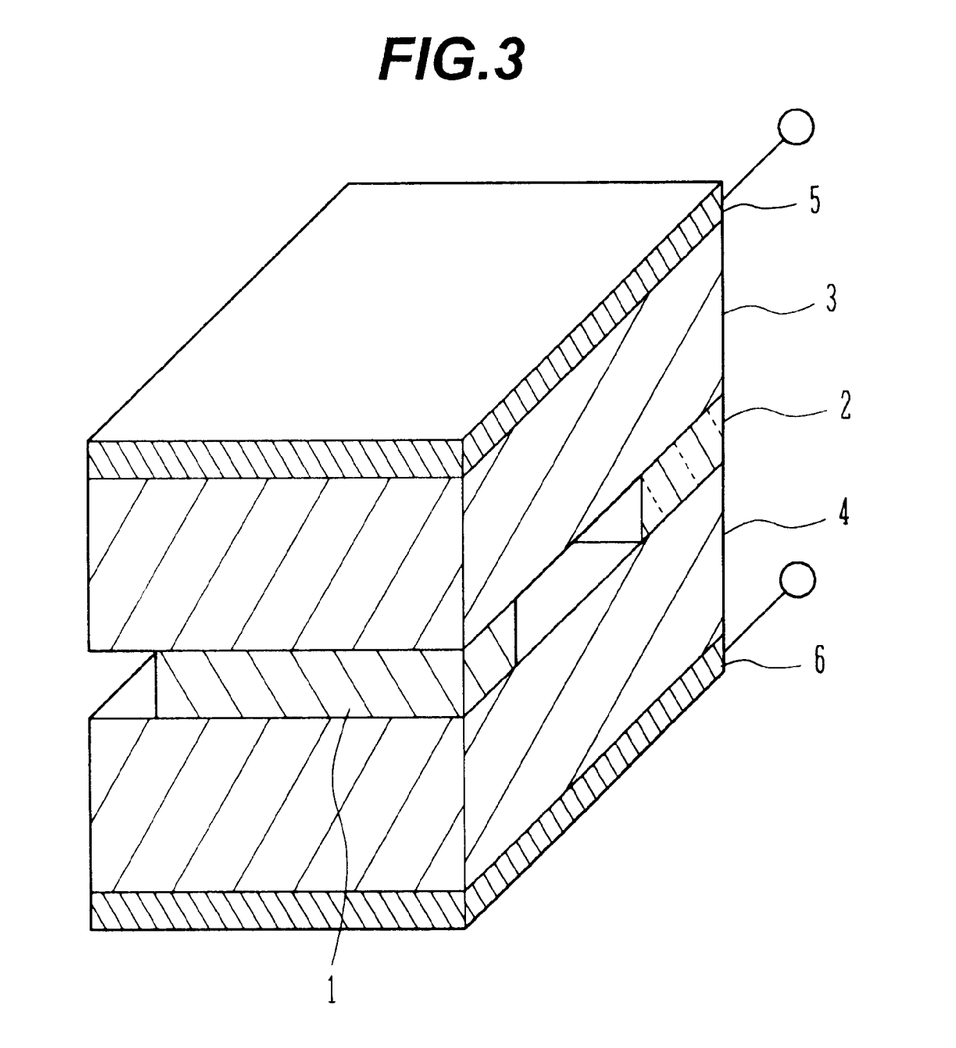
FIG. 3 is an oblique partial cutaway diagram showing one compositional example of a light-emitting device according to this embodiment.

Next, a concrete compositional example of a light-emitting device based on the principles of the thermal energy device illustrated in FIG. 2 will be described with reference to FIG. 3. FIG. 3 gives an oblique view of a quarter portion of the light-emitting device, cut in two planes which intersect orthogonally at the centre of the device.

An n-type Peltier laminated structure 3 and a p-type Peltier laminated structure 4 are positioned such that their hot junction faces confront each other, and a light-emitting element 1 is positioned between the two hot junction faces, approximately in the centre thereof. A fixing member 2 made from $SiO_2$ is placed between the hot junction faces in a different portion thereof, such that a uniform interval is maintained between the n-type Peltier laminated structure 3 and the p-type Peltier laminated structure 4. A cooling plate 5 is fixed to the cold junction face of the n-type Peltier laminated structure 3 and a cooling plate 6 is fixed to the cold junction face of the n-type Peltier laminated structure 4.

Figure 4A:
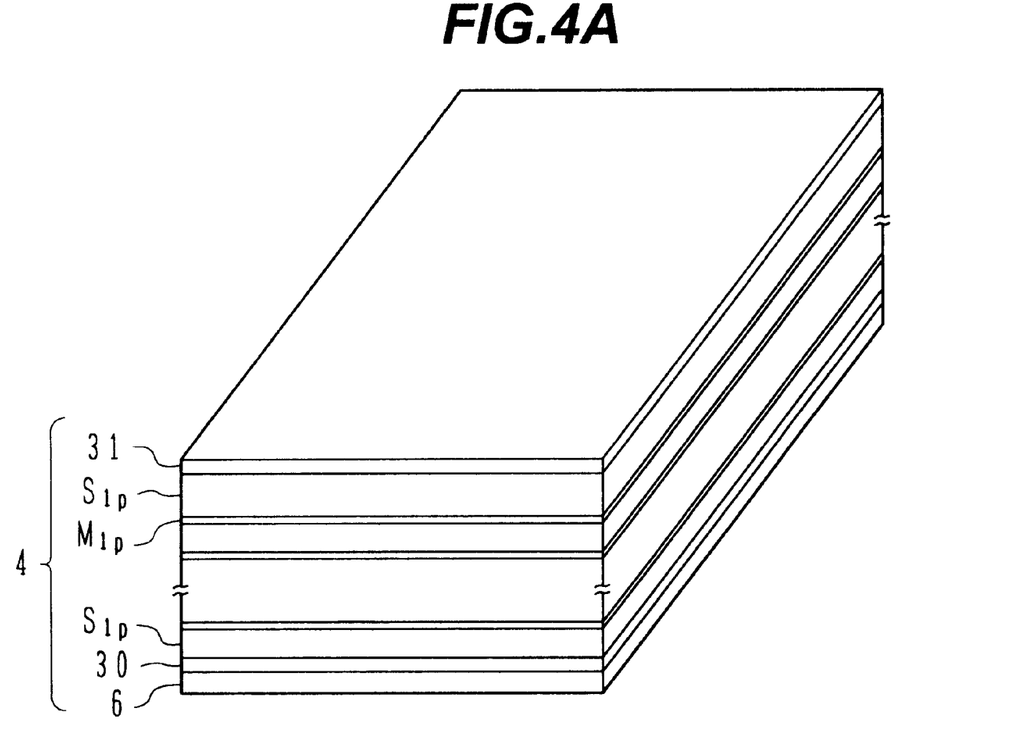
FIG. 4A is an oblique view of a p-type Peltier lamination structure of the light-emitting device shown in FIG. 3.

FIG. 4A shows the detailed composition of the p-type Peltier laminated structure 4 in the light-emitting device in FIG. 3. Plural layers of a thermal energy semiconductor layer $S_{1P}$ made from p-type PbTe and a metal layer $M_{1n}$ made from Au are laminated together alternately. This laminated structure is made by the following method, for example.

Firstly, a p-type PbTe sheet is surface-cleaned using a combined solution of HBr and $Br_2$. Au film is then vapor-deposited onto either side of the cleaned PbTe sheet, Au is plated thereon, and AuSn alloy layers are also vapor-deposited. By layering and bonding PbTe sheets fabricated in this way, a laminated structure of PbTe and Au is obtained.

Metal layers 30 and 31 made from AuSn alloy appear on either side of this laminated structure. A p-type Peltier laminated structure 4 is formed by the metal layer 30, the laminated structure comprising the thermoelectric semiconductor layers $S_{1P}$ and the metal layers $M_{1P}$, and the metal layer 31. The p-type Peltier laminated structure 4 and the cooling plate are bonded together by bonding the cooling plate 6 to the lower face of the metal layer 30. Thereupon, the four sides faces are finished by polishing.

The n-type Peltier laminated structure 3 in FIG. 3 has a structure wherein thermoelectric semiconductor layers made from n-type PbTe are used instead of the p-type thermoelectric semiconductor layers $S_{1P}$ in FIG. 4A, and the order of lamination is reversed vertically.

Figure 4B:
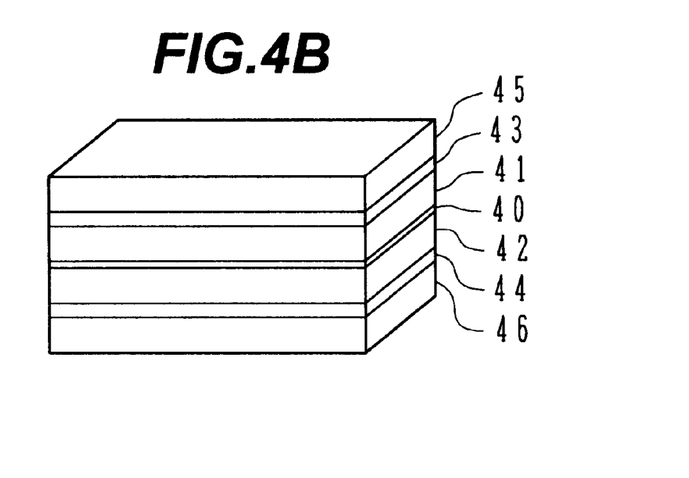
FIG. 4B is an oblique view of the light-emitting element thereof.

FIG. 4B shows the detailed structure of the light-emitting element 1 in FIG. 3. A light-emitting layer (light-emitting region) 40 made from InGaAsP is placed in between a cladding layer 41 made from n-type InP and a cladding layer 42 made from p-type InP. These three layers are further positioned between a buffer layer 43 made from n-type InP and a buffer layer 44 made from p-type InP. These five layers are placed between an n-type PbTe layer 45 and a p-type PbTe layer 46.

A light-emitting device 1 having this structure is fabricated by a commonly known buried structure growing technique, or the like. Below, this method is described briefly.

A cladding layer made from n-type InP, a light-emitting region made from InGaAsP, and a cladding layer made from p-type InP are laminated in that order onto an n-type InP substrate, thereby forming a double hetero-structure. Using an $SiO_2$ dielectric layer, or the like, as a mask, the p-type cladding layer and the light-emitting region are selectively etched to form a mesa stripe structure. Thereupon, a p-type InP layer and an n-type InP layer are grown selectively to bury the mesa stripe structure. The $SiO_2$ is then removed and a cladding layer of p-type InP is grown over the whole surface.

Next, an n-type PbTe layer is grown epitaxially onto the rear face of the n-type InP substrate, and a p-type PbTe layer is grown epitaxially onto the p-type InP cladding layer. Gold films are fabricated by vapor deposition onto the surfaces of the n-type PbTe layer and the p-type PbTe layer, and gold is then plated thereon. The light-emitting element 1 illustrated in FIG. 4B is then obtained by subsequent cleavage or polishing.

Returning now to FIG. 3, the method of operation of the light-emitting device will be described. Bonding between the n-type Peltier laminated structure 3 and the light-emitting element 1, and between the p-type Peltier laminated structure 4 and the light-emitting element 1 is carried out by adhesion using solder, for example. The fixing member 2 is bonded to the Peltier laminated structure 3 and 4 on either side thereof by a similar method.

The light-emitting device manufactured in this way has a structure equivalent to the band diagram shown in FIG. 2. A voltage is supplied via input voltage terminals connected to the respective cooling plates 5 and 6. Under conditions where the electric-to-optical conversion efficiency $\eta_L$ of the light-emitting element 1 is 80%, the current is 1A, the ambient temperature $T_R$ is 300K, the input power is 16.5 mW, and the thermal conductivity $K_F$ between the light-emitting element 1 and the ambient air is $4.73 \times 10^{-3}$ W/K, the following light emission performance is obtained.

| | |
|---|---|
| Light output | $P_L$ = 1 (W) |
| Electric-to-optical conversion efficiency | β = 6009 (%) |
| Quantity of heat absorbed | $Q_C$ = 529 (mW) |
| Temperature of cold junction | $T_C$ = 250 (K) |
| Temperature of hot junction | $T_H$ = 251 (K) |
| Coefficient of performance | COP = 32 |

In this way, a large figure of 6009% was obtained for the electric-to-optical conversion efficient β. This electric-to-optical conversion efficiency β is the ratio ($Q_L/P_{IN}$) between the electric power $P_{IN}$ applied to either end of the element from external sources, and the light energy $Q_L$ discharged from the element, and it differs from the ratio $\eta_L$ between the Peltier emission energy $Q_{PH}$ input to the light-emitting region and the light energy $Q_L$.

If the conversion efficiency exceeds 100%, then this is because Peltier emission energy $Q_{PH}$ exceeding the input power is converted to light energy $Q_L$ and output from the element. Moreover, from equations (1.5) and (1.7), this Peltier emission energy $Q_{PH}$ is expressed as the Peltier heat absorption $Q_{PC}\{1+(\Delta T_s/T_c)\}$ at the cold junction. In other words, since the light energy $Q_L$ is supplied by the energy of the metal which contains Peltier absorption energy exceeding the input power, the electric power corresponding to the light energy $Q_L$ does not need to be supplied from external sources. Therefore, the electric power required in the elements is simply the small amount of power needed to transport the electrons which have given up their heat at the cold junction to the light-emitting region.

In this way, in the present device, it is possible to achieve high-efficiency light emission in excess of 100% efficiency, without generation of heat. This indicates that by parallel operation of the present device, light amplification without accompanying heat emission is possible, and a large optical output can be obtained.

Next, an electric power extracting device using the light-emitting device illustrated in FIG. 3 is described with reference to FIG. 5.

Figure 5:
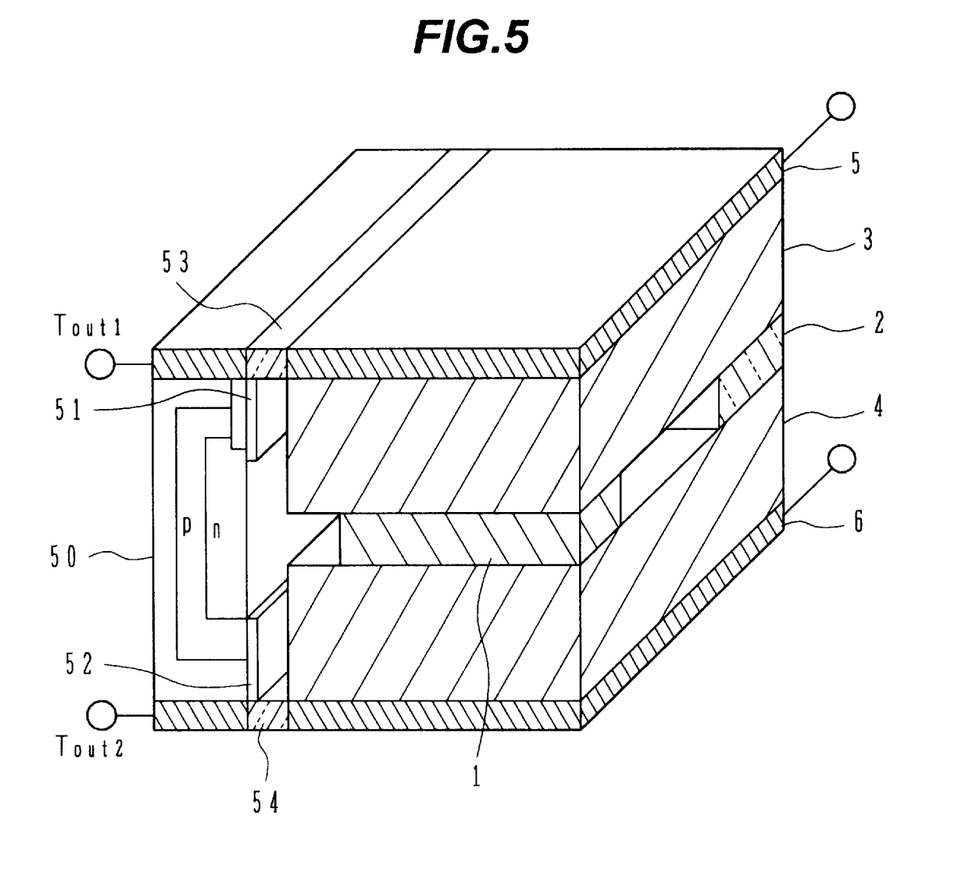
FIG. 5 is an oblique partial cutaway diagram showing one compositional example of an electric power extracting device according to an embodiment.

FIG. 5 shows an oblique view of a quarter portion of an electric power extracting device. A photodiode 50 is located in a position where it receives light emitted by the light-emitting element 1 in the light-emitting device shown in FIG. 3. Although not illustrated in FIG. 5, a further photodiode is located such that it confronts the other light-radiating face of the light-emitting element 1. The photodiode 50 receives light emitted by the light-emitting element 1 and outputs photoelectric power between output terminal $T_{OUT1}$ and $T_{OUT2}$.

The photodiode 50 is positioned such that the pn junction face thereof is orthogonal to the optical axis of the light-emitting element 1, thereby improving the effective conversion efficiency. Moreover, the photoelectric conversion efficiency is further raised by matching the peak wavelength of the light emission spectrum with the peak wavelength of the photodiode. Photoelectric conversion efficiency can be improved two or three fold, approximately, compared to a photoelectric converting element which uses only a portion of the solar spectrum, such as a solar cell.

From the structure and dimensions of the light-emitting element 1 and the thermal conductivity, $\chi$=70 (W/K·cm), of the fixing member 2, the thermal conductivity $K_F$ between the light-emitting element 1 of this power converting device and the ambient air can be estimated to be of the order of $K_F$=4.73×10$^{-3}$ W/K.

The following electric power extraction performance is obtained when the power extracting device shown in FIG. 5 is operated under conditions of: photoelectric conversion efficiency $\eta_E$=80% in the photodiode 50; current I=1A; ambient air temperature $T_R$=300 K; and input electric power $P_{IN}$=16.5 mW.

| | |
|---|---|
| Electrical output | $P_E$ = 0.8 W |
| Power extraction rate | $\gamma$ = 48.5 (4850%) |
| Quantity of heat absorbed | $Q_C$ = 329 (mW) |
| Quantity of heat emitted at hot junction | $Q_H$ = −464 (mW) |
| Temperature of cold junction | $T_C$ = 250 (K) |
| Temperature of hot junction | $T_H$ = 251 (K) |
| Temperature of photodiode | $T_D$ = 251 (K) |

Heat generated by the photodiode 50 passes through thermal conductors running from the p and n electrodes of the photodiode, for example, 5 μm thick gold plating layers 51, 52, and insulating thermal conductors 53, 54, and the heat is absorbed by the respective cooling plate 5, 6. The heat generated by the photodiode 50 is 100 mW under the foregoing conditions. This is because, as the photoelectric conversion efficiency $\eta_E$=80%, 200 mW of the 1 W of input electric power becomes heat, and hence the heat generated by the photodiode on one side of the device is half of this value, namely, 100 mW. Therefore, although the quantity of heat absorbed by the absorbing plates 5 and 6, respectively, is reduced by the 100 mW of heat generated by the photodiode 50, they still have a cooling function and the quantity of heat absorbed by each cooling plate 5 and 6 is 164 mW. When the p-type and n-type cooling plates 5 and 6 are combined, the quantity of heat absorbed thereby is 329 mW, and the coefficient of performance is 19.8.

The approximate thermal conductivity $K_{NM}$ between the central portion of the n-type layer of the photodiode 50 and the cooling plate 5 or 6 is expected to be about $3.32 \times 10^{-3}$ (W/K) when InP is used for the substrate of the photodiode 50. Here, the composite thermal conductivity $K_{NM}$ is determined from $((1/K_N)+(1/K_M))^{-1}$, assuming a series relationship between thermal conductivity $K_N$, wherein the effective length of the InP n-type layer in the direction of thermal flow is 200 μm, the width is 1 mm, the thickness is 0.2 mm and the thermal conductivity is 0.68 W/K·cm, and thermal conductivity $K_M$, wherein the effective length of the metal plate conductor is 400 μm, the thickness is 5 μm, the width is 1 mm, and the thermal conductivity is 2.95 W/K·cm.

Moreover, since the quantity of heat $Q_D$ absorbed by either one of the cooling plates 5 or 6 from the central region of the n-type layer of one of the photodiodes is 50 mw (100 mW/2), the temperature rise at the centre of the n-type layer of one photodiode $\Delta T_{NM}$, will be given by $\Delta T_{NM}=(Q_D/K_{NM})$=15K, and the temperature of the photodiode $T_D$ will be 265K.

As stated above, in the electric power extracting device according to the present embodiment, high-efficiency performance is obtained with a power extraction rate of 48.5 (4850%). The power extraction rate is the ratio between the electrical output $P_E$ and the applied power $P_{IN}$. The power extraction rate exceeds 100% because of the contribution of thermal energy by the metal at the cold junction, as described previously in relation to the light-emitting device in FIG. 3.

By parallel operation of this electric power extracting device, a large electric power can be extracted without accompanying generation of heat, thereby enabling application of the device to low-temperature high-capacity electrical generating equipment.

Next, a cooling device based on the principles of the thermoelectric device in FIG. 2 is described with reference to FIG. 6.

Figure 6:
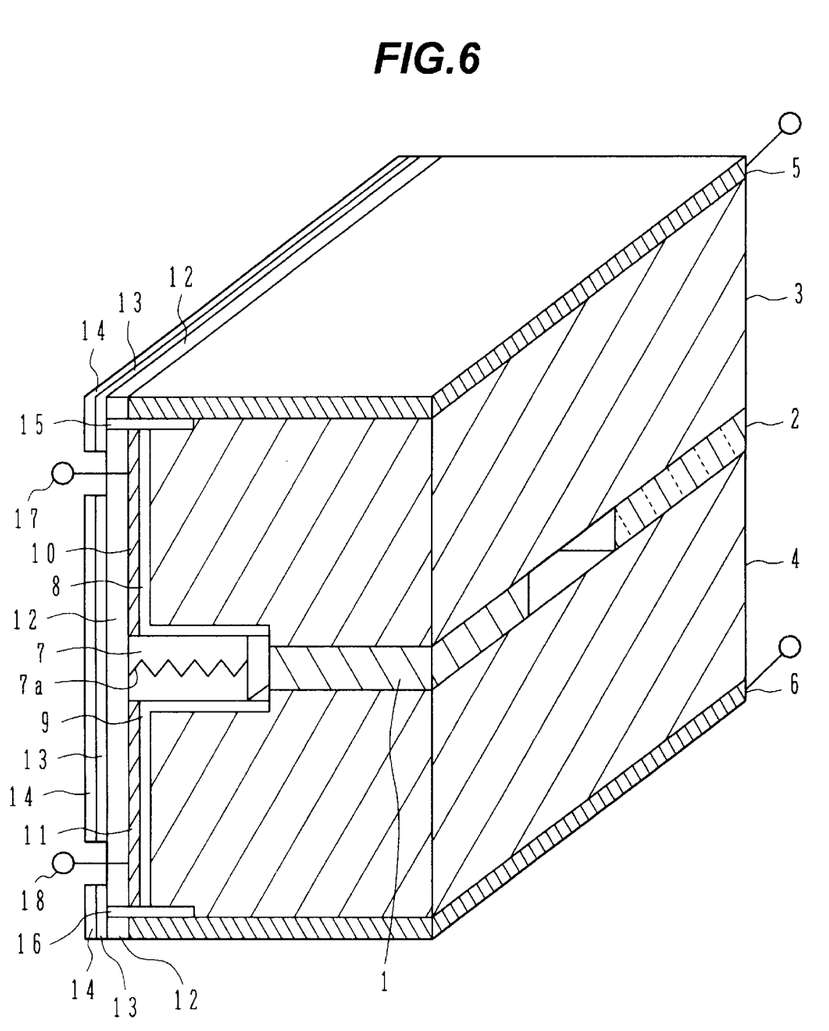
FIG. 6 is an oblique partial cutaway diagram showing one compositional example of a cooling device according to an embodiment.

FIG. 6 is an oblique view of a quarter portion of a cooling device. Arr n-type Peltier laminated structure 3, a p-type Peltier laminated structure 4, a light-emitting element 1, a fixing member 2, and cooling plates 5, 6 are arranged similarly to the light-emitting device shown in FIG. 3. A photodiode 7 is located in the gap between the n-type Peltier laminated structure 3 and the p-type Peltier laminated structure 4, in the vicinity of the light-emitting element 1. Insulation is provided by an insulating region 8 between the photodiode 7 and the n-type Peltier laminated structure 3, whilst the photodiode 7 and the n-type Peltier laminated structure 4 are insulated from each other by an insulation region 9 therebetween. Light emitted from the light-emitting element 1 is directed to the photodiode 7.

The insulating regions 8 and 9 are coated respectively onto the sides of the n-type Peltier laminated structure 3 and the p-type Peltier laminated structure 4 demarcated as the sides whereon the photodiode 7 will be positioned. Electrodes 10 and 11 are formed respectively onto the sides of the insulating regions 8 and 9. These electrodes 10 and 11 are connected respectively to the photodiode 7 and the photoelectric power from the photodiode 7 is supplied between the electrodes 10 and 11.

An insulating layer 12 is fabricated onto the side faces of the electrodes 10 and 11 and the end face of the photodiode 7. A black body layer 13 and a covering layer 14 are laminated in that order onto the side faces of the insulating layer 12. Electrode terminals 17 and 18 run respectively from the electrodes 10 and 11, via the insulating layer 12, black body layer 13 and covering layer 14.

Below, a method for manufacturing this cooling device is described. Bonding between the n-type Peltier laminated structure 3 and the light-emitting element 1, and between the p-type Peltier laminated structure 4 and the light-emitting element 1, is carried out by adhesion using solder, or the like, for example. Bonding between the fixing member 2 and the two Peltier laminated structures 3 and 4 is performed in a similar manner. The parts, e.g. photodiode 7, are similarly joined by thermal bonding using AuSn, or the like.

The laminated structure comprising the electrodes 10, 11, insulating layer 12, black body layer 13, and the like, and the insulating regions 15 and 16 are formed by a standard package multi-layering technique.

In the cooling device shown in FIG. 6, the spacing between the photoreceptive end face of the photodiode 7 and the emitting end face of the light-emitting element 1 is shortened, such that optical loss can be reduced and compactification can be achieved. Furthermore, the photoreceptive surface area may be effectively increased by providing sawtooth-shaped indentations on the pn junction face 7a of the photodiode 7. Moreover, a plurality of pn junctions may be provided in series, and a prescribed voltage value may be extracted by changing the number of pn junctions.

Furthermore, desirably, the band gap of the photoreceptor (pn junction) of the photodiode 7 should be practically the same as the band gap of the light-emitting section of the light-emitting element 1. By adopting a composition of this kind, the light energy emitted from the light-emitting element 1 can be converted efficiently into electrical energy. Here, a band gap is considered to be practically the same when it corresponds to a wavelength contained within the full width of half maximum of the wavelength producing the peak in the light emission spectrum of the light-emitting element 1.

An insulating layer 12 made from quartz glass, $SiO_2$, or the like, is provided on the side faces of the electrodes 10, 11, and a black body layer 13 made from carbon, graphite, or the like, is provided on these side faces. The ends of the black body layer 13 are thermally coupled, respectively, to the cooling plates 5, 6 via the insulating thermal conductors 15, 16. Light emitted from the emitting end face of the light-emitting element 1 undergoes multiple reflection and reflective scattering at the photodiode 7, electrodes and insulating layers of the light-emitting element 1, and the like, and the small amount of thermal energy caused by this reflected light is ultimately absorbed by the black body layer 13, and it is also absorbed by the cooling plates 5, 6. The electrodes 10, 11 also guide Joule heat generated by the photodiode 7 to the cooling plates 5, 6, respectively. The electrodes are fabricated, for example, by gold plate conductors approximately 5 $\mu$m thick. The total quantity of heat including the small amount of thermal energy caused by slight reflection at the emitting end faces of the light-emitting element 1, and the Joule heat, is absorbed by the cooling plates 5 and 6.

The cooling device shown in FIG. 6 gives the following cooling performance when operated under conditions of: input power $P_{IN}$=16.5 mW; current I=1A; electric-to-optical conversion efficiency $\eta_L$=80% in the light-emitting element 1; photoelectric conversion efficiency $\eta_E$=80% in the photodiode 7, and thermal conductivity between the light-emitting element 1 and the ambient air of $K_F$=4.73×10$^{-3}$ (W/K).

| | |
|---|---|
| Coefficient of performance | COP = 16.9 |
| Quantity of heat absorbed | $Q_C$ = 329 (mW) |
| Electrical output | $P_E$ = 0.8 (W) |
| Quantity of heat emitted at hot junction | $Q_H$ = −464 (mW) |
| Temperature of cold junction | $T_C$ = 250 (K) |
| Temperature of hot junction | $T_H$ = 251 (K) |
| Temperature of photodiode | $T_D$ = 268 (K) |
| Volume of device | VOL = 1.1 × 1.1 × 1.2 mm$^3$ |

When InP having a thermal conductivity of 0.68 (W/K·cm) was used for the photodiode 7, similarly to the photodiode 50 in FIG. 5, the temperature rise $T_J$ at the pn junction for the photodiode on one side (length 200 $\mu$m; width 1 mm; thickness 300 $\mu$m; power loss 100 mW) was a slight 0.25K. This value is calculated taking the thermal conductivity of the photodiode 7 (effective length in direction of thermal flow: 100 $\mu$m; surface area: 1 mm×0.3 mm) as 0.204 (W/K), and the power loss as 50 mW (100 mW/2).

Furthermore, the temperature rise $\Delta T_M$ of the metal plate conductors 10, 11 (length in direction of thermal flow: 500 $\mu$m; surface area: 5 $\mu$m×1 mm) running respectively from the p-type and n-type semiconductor electrodes of the photodiode on one side (thermal loss 100 mW) is 17K if metal plate conductors having a thermal conductivity of 2.95 (W/K·cm) are used, since their thermal conduction rate is 2.95×10$^{-3}$ (W/K) and the power loss therein is 50 mW (100 mW/2).

Consequently, the temperature rise $\Delta T_{JM}$ between the pn junction of the photodiode and the cooling plates is $\Delta T_{JM}$=$\Delta T_J$+$\Delta T_M$=17.25K. In other words, the temperature rise due to heat generation by the photodiode 7 is determined also entirely by the temperature of the metal plate conductors 10, 11, and since the temperature of the photodiode $T_D$ is 268K, a region hotter than the cold junction temperature $T_C$ is generated. The temperature rise in the black body is equal to or less than the temperature rise in the metal plates.

As described above, in the cooling device according to the present embodiment, the element as a whole cools down, and at a very small input power of 16.5 mW, a coefficient of performance of 16.9 (1690%), highest element temperature of 268K, heat absorption rate of 32.9 (W/cm$^2$), and an electrical output of 0.8 W are obtained, and the element is able to provide both a cooling function and an electricity output function, whilst the element is also compactified. These functions are achieved by converting the lower-order thermal energy given up by the metal to electricity, which is a higher-order form of energy, and leading this electricity out of the element. Needless to say, by optimizing thermoelectric parameters, materials, and the like, the dimensions and shape of the element can be further compactified.

Above, the present invention was described in accordance with embodiments, but the present invention is not limited to these embodiments. For example, it should be evident to someone operating in this field that a variety of modifications, improvements, combinations, and the like, are possible.

What is claimed is:

1. A thermoelectric system comprising:
   a first thermoelectric semiconductor member having a cold end and a hot end;
   a first member made from a metal or semiconductor connected to the cold end of said first thermoelectric semiconductor member, formed from a material wherein heat absorption occurs when first carriers comprising electrons or holes are injected from said first member into said first thermoelectric semiconductor member; and
   a light-emitting region made from a semiconductor material, wherein light emission occurs due to recombination between electrons and holes by gathering of said first carriers transported to the hot end of said first thermoelectric semiconductor member.

2. The thermoelectric system according to claim 1, wherein the heat absorption occurring at said cold end of said first thermoelectric semiconductor member is caused by the Peltier effect.

3. The thermoelectric system according to claim 1, further comprising a first buffer layer located between said first thermoelectric semiconductor member and said light-emitting region, for relaxation of lattice mismatching between said first thermoelectric semiconductor member and said light-emitting region.

4. The thermoelectric system according to claim 1, further comprising a second thermoelectric semiconductor member having a cold end and a hot end, wherein second carriers comprising either electrons or holes, which are different to said first carriers, are injected from said hot end into said light-emitting region; and a second metal member connected to the cold end of said second thermoelectric semiconductor member, which is made from a material wherein heat absorption due to the Peltier effect occurs when said second carriers are injected from said second metal member into said second thermoelectric semiconductor member.

5. The thermoelectric system according to claim 4, further comprising a second buffer layer located between said second thermoelectric semiconductor member and said light-emitting region, for easing lattice mismatching between said second thermoelectric semiconductor member and said light-emitting region.

6. The thermoelectric system according to claim 4, wherein said second thermoelectric semiconductor member is constituted by laminating a semiconductor material and a metallic material, alternately, heat absorption due to the Peltier effect occurring when said second carriers are injected from the metallic material into the semiconductor material.

7. The thermoelectric system according to claim 4, wherein said first and second thermoelectric semiconductor members are positioned such that their hot ends are mutually facing, and said light-emitting region is located only in a portion of the space between the two hot end faces, further comprising a fixing member, provided in the region of the space between the hot end faces of said first and second thermoelectric semiconductor members where said light-emitting region is not located, which is made from an electrically insulating material and fixes said first and second thermoelectric semiconductor members together mechanically.

8. The thermoelectric system according to claim 1, wherein said first thermoelectric semiconductor member is constituted by alternately laminating a semiconductor material and a metallic material, heat absorption due to the Peltier effect occurring when said first carriers are injected from the metallic material into the semiconductor material.

9. The thermoelectric system according to claim 1, further comprising a photoelectric converting element, for receiving light from said light-emitting region, and converting light energy to electrical energy.

10. The thermoelectric system according to claim 9, wherein said photoelectric converting element is made from a semiconductor material having a band gap approximately equal to the band gap of the semiconductor material forming said light-emitting region.

11. The thermoelectric system according to claim 9, wherein said light-emitting region comprises a plurality of light-radiating surfaces, and a plurality of photoelectric converting elements are provided, such that they face respectively each of said plurality of light-radiating surfaces.

12. The thermoelectric system according to claim 9, wherein said photoelectric converting element is a photodiode comprising a pn junction and the face of said pn junction contains indentations.

13. The thermoelectric system according to claim 9, further comprising a first thermally conductive member which thermally couples said photoelectric converting element and said first member, and causes said heat generated by said photoelectric converting element to flow into said first member.

14. The thermoelectric system according to claim 1, further comprising a black body for absorbing light reflected from the light-radiating end faces of said light-emitting region.

15. The thermoelectric system according to claim 14, further comprising a second thermally conductive member, which thermally couples said black body to said first member, such that heat generated by absorption of light in the black body flows into said first member.

* * * * *